United States Patent
Bronn et al.

(10) Patent No.: US 11,620,559 B2
(45) Date of Patent: Apr. 4, 2023

(54) REDUCTION OF SPONTANEOUS EMISSION AND THERMAL PHOTON NOISE IN QUANTUM COMPUTING MACHINES USING A GALVANICALLY GROUNDED FILTER

(71) Applicant: International Business Machines Corporation, Armonk, NY (US)

(72) Inventors: Nicholas Torleiv Bronn, Long Island City, NY (US); Patryk Gumann, Tarrytown, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1094 days.

(21) Appl. No.: 16/269,185

(22) Filed: Feb. 6, 2019

(65) Prior Publication Data

US 2020/0250565 A1 Aug. 6, 2020

(51) Int. Cl.
| | |
|---|---|
| G06N 10/00 | (2022.01) |
| G06N 10/40 | (2022.01) |
| H05K 1/02 | (2006.01) |
| B82Y 10/00 | (2011.01) |
| H01P 1/203 | (2006.01) |
| F25B 9/00 | (2006.01) |

(52) U.S. Cl.
CPC .............. *G06N 10/00* (2019.01); *B82Y 10/00* (2013.01); *G06N 10/40* (2022.01); *H01P 1/2039* (2013.01); *H05K 1/0203* (2013.01); *H05K 1/0216* (2013.01); *F25B 9/00* (2013.01)

(58) Field of Classification Search
CPC .... H05K 1/0203; H01P 1/2039; G06N 10/40; G06N 10/00
USPC ........................................ 333/99 S, 185, 202
See application file for complete search history.

(56) References Cited

U.S. PATENT DOCUMENTS

| | | | |
|---|---|---|---|
| 8,208,502 | B2 | 6/2012 | Srinivasan et al. |
| 8,841,764 | B2 | 9/2014 | Poletto et al. |
| 8,928,391 | B2 | 1/2015 | Naaman et al. |
| 9,438,246 | B1 | 9/2016 | Naaman |
| 9,692,423 | B2 | 6/2017 | McDermott, III et al. |
| 9,946,973 | B2 | 4/2018 | Biercuk et al. |

(Continued)

FOREIGN PATENT DOCUMENTS

| | | |
|---|---|---|
| WO | 2009039844 A9 | 11/2009 |
| WO | 2018052427 A1 | 3/2018 |

OTHER PUBLICATIONS

International Searching Authority, PCT/EP2020/051599, P201805968, dated Apr. 28, 2020.

(Continued)

*Primary Examiner* — Rakesh B Patel
(74) *Attorney, Agent, or Firm* — Garg Law Firm, PLLC; Rakesh Garg; Erik Johnson

(57) ABSTRACT

Protecting qubits of a quantum processor from spontaneous emission and thermal photon noise includes connecting a first port of a filter to a signal line of a readout resonator of a qubit circuit of a quantum processor. The filter has a passband including a readout resonator frequency associated with the readout resonator and a first stopband including a qubit transition frequency associated with the qubit circuit. A second port of the filter is connected to a measurement device. a signal line of the filter is galvanically connected to a reference ground in thermal contact to a stage of a cryostat. The galvanic connection further makes a thermal connection to an input signal line of the qubit circuit.

21 Claims, 11 Drawing Sheets

(56) References Cited

U.S. PATENT DOCUMENTS

| | | |
|---|---|---|
| 9,971,970 B1 | 5/2018 | Rigetti et al. |
| 10,013,657 B2 | 7/2018 | Bourassa et al. |
| 2016/0377230 A1 | 12/2016 | Chuard et al. |
| 2017/0132524 A1 | 5/2017 | Abdo |
| 2017/0257074 A1 | 9/2017 | Yeh et al. |
| 2018/0054201 A1 | 2/2018 | Reagor et al. |

OTHER PUBLICATIONS

Zhang et al., "Suppression of photon shot noise dephasing in a tunable coupling superconducting qubit", 2017. https://arxiv.org/pdfZ1603.01224.pdf.

Wang et al., Cavity Attenuators for Superconductin Qubits, Jul. 12, 2018.

Kaijun Song, Inductance-Loaded Y-Shaped Resonators and Their Applications to Filters, IEEE vol. 58, No. 4, Apr. 2010.

Nicholas T. Bronn et al., Broadband filters for Abatement of Spontaneous emission in circuit quantum electrodynamics, 2015.

A.A. Houck et al., Controlling the Spontaneous Emission of a Superconducting Transmon Qubit, Aug. 22, 2008.

P Bertet et al., Dephasing of a Superconductiong Qubit Induced by Photon Noise, Dec. 16, 2005.

REDUCTION OF SPONTANEOUS EMISSION AND THERMAL PHOTON NOISE IN QUANTUM COMPUTING MACHINES USING A GALVANICALLY GROUNDED FILTER

TECHNICAL FIELD

The present invention relates generally to a method, system, and apparatus for quantum computing machines. More particularly, the present invention relates to a method, system, and apparatus for reduction of both spontaneous emission and thermal photon noise in quantum computing machines using a galvanically grounded filter.

BACKGROUND

Hereinafter, a "Q" prefix in a word or phrase is indicative of a reference of that word or phrase in a quantum computing context unless expressly distinguished where used.

Nature—including molecules—follows the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a processor fabricated using semiconductor technology, a semiconductor memory, and a magnetic or solid-state storage device, in what is known as a Von Neumann architecture. Particularly, the processors in conventional computers are binary processors, i.e., operating on binary data represented by strings comprising 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, or both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s are physically implemented by on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0) can depend on the state of another, and that there is more information that can be ascertained about the two qubits when they are entangled than when they are treated individually. Using these two principles, qubits operate as more sophisticated processors of information, enabling quantum computers to function in ways that allow them to solve difficult problems that are intractable using conventional computers.

A roadblock to the development of universal quantum computers is that of preventing decoherence of qubits. Two measures related to coherence of a qubit are the relaxation time ($T_1$) and decoherence time ($T_2$), which incorporates both the relaxation and dephasing times. The relaxation time ($T_1$) is a measure of a time for the qubit to relax towards the ground state and is representative of the lifetime of the qubit. The decoherence time ($T_2$) is a measure of a time for quantum coherence, which in addition to relaxation, includes the dephasing time which characterizes the phase information of the qubit becoming spread out such that the information contained within the phase of the qubit loses coherence.

In the circuit quantum electrodynamic (QED) architecture, qubits are coupled to microwave transmission line cavities. In circuit QED architectures, relaxation times are typically set by spontaneous photon emission through the cavity. The maximum possible relaxation time is set by the Purcell effect, i.e. no coupling to defects, quasiparticles, etc.). Further, in circuit QED architectures, the cavity readout rate is inversely proportional to the relaxation time or qubit lifetime ($T_1$) set by the Purcell effect. Spontaneous emission is the relaxation of the qubit due to the Purcell effect, coupling to defects, quasiparticles, etc., and thermal photon noise is caused by room temperature instruments that generate control and measurement signals, insufficient shielding from blackbody radiation, the backaction of microwave amplifiers, components that do not achieve the desired temperature because of insufficient thermalization to the appropriate temperature stage of the cryostat, etc.

Accordingly, a need exists for protecting qubits in quantum computing devices from spontaneous photon emission and dephasing to maintain coherence.

SUMMARY

The illustrative embodiments provide a method, system, and apparatus. An embodiment of a method to protect qubits of a quantum processor from spontaneous emission and thermal photon noise includes connecting a first port of a filter to a signal line of a readout resonator of a qubit circuit of a quantum processor. In the embodiment, the filter has a passband including a readout resonator frequency associated with the readout resonator and a first stopband including a qubit transition frequency associated with the qubit circuit. The embodiment further includes connecting a second port of the filter to a measurement device. The embodiment still further includes galvanically connecting a signal line of the filter to a reference ground in thermal contact to a stage of a cryostat, the galvanic connection further making a thermal connection to an input signal line of the qubit circuit.

In another embodiment, the filter includes a bandpass filter. In another embodiment, the filter includes a Purcell filter. In another embodiment, the filter further includes a second stopband including an amplifier pump frequency. In another embodiment, the filter includes a quarter wavelength resonator filter.

In another embodiment, the filter and qubit circuit are disposed within a dilution refrigerator.

In another embodiment, the filter comprises a quarter wavelength microstrip stub coupled to a ground plane. In another embodiment, the filter further comprises a first transmission line and a second transmission line coupled to and coplanar with the quarter wavelength microstrip stub which terminates to a galvanic connection to a ground plane by a via. In another embodiment, the quarter wavelength microstrip stub is disposed perpendicular to the first transmission line and the second transmission line.

In another embodiment, the filter comprises an inductance-loaded Y-shaped resonator. In another embodiment, the thermal connection is configured to reduce thermal photon noise in the output signal line. In another embodiment, the filter is constructed of a material having a reduced thermal boundary resistance.

An embodiment of a system for protecting qubits of a quantum processor from spontaneous emission and thermal photon noise includes a qubit circuit of a quantum processor, the qubit circuit having a qubit coupled to a readout resonator. The embodiment further includes a filter having a first port of a filter to a signal line of the readout resonator, the filter having a passband including a readout resonator frequency associated with the readout resonator and a first stopband including a qubit transition frequency associated with the qubit circuit. The embodiment further includes a measurement device connected to a second port of the filter. In the embodiment, a signal line of the filter is galvanically connected to a reference ground in thermal contact to a stage of a cryostat, the galvanic connection further making a thermal connection to an input signal line of the qubit circuit.

An embodiment of an apparatus for protecting qubits of a quantum processor from spontaneous emission and thermal photon noise includes a filter having a first port for connection to a signal line of a readout resonator of a qubit circuit of a quantum processor. In the embodiment, the filter has a passband including a readout resonator frequency associated with the readout resonator and a first stopband including a qubit transition frequency associated with the qubit circuit. In the embodiment, the filter further includes a second port for connection to a measurement device. In the embodiment, a signal line of the filter is galvanically connected to a reference ground in thermal contact to a stage of a cryostat, the galvanic connection further making a thermal connection to an input signal line of the qubit circuit.

BRIEF DESCRIPTION OF THE DRAWINGS

Certain novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
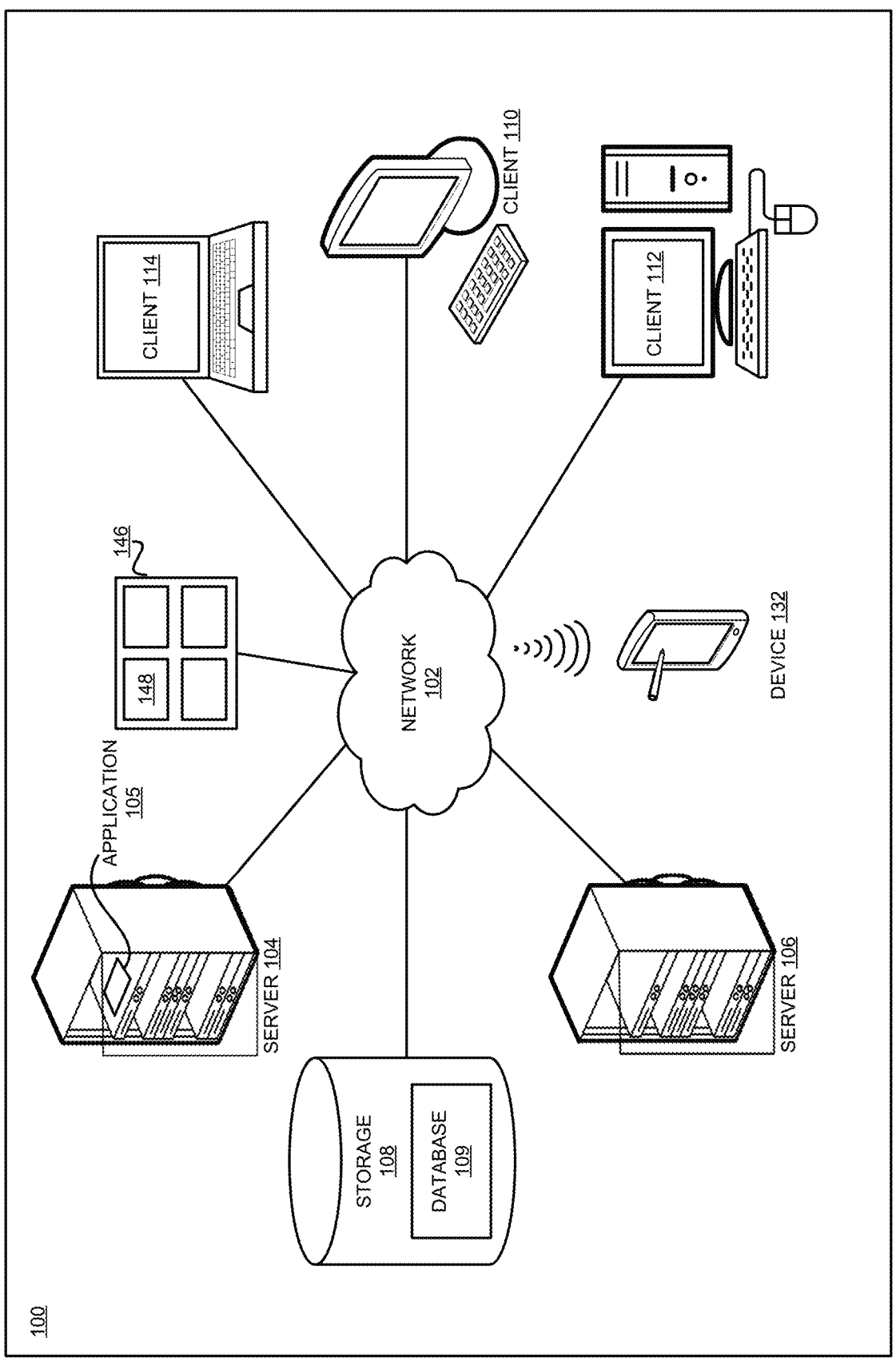
FIG. 1 depicts a block diagram of a network of data processing systems in which illustrative embodiments may be implemented.

The illustrative embodiments recognize that the presently available devices or solutions do not address these needs/problems or provide adequate solutions for these needs/problems. Embodiments recognize that in most circuit QED architectures, microwave filters are connected to a ground by capacitors which consist of dielectrics that do not allow electronic conduction (i.e., are non-galvanic). Embodiments further recognize that these capacitors are usually poor heat conductors because of the properties of the dielectric material between the conductive layers of the capacitor. Accordingly, the signal line is not properly thermalized with the ground part of the capacitor. Because the signal part of the filter is "hotter," there is excess thermal noise.

A qubit circuit is often coupled to a readout resonator comprised of microwave resonators for readout of the qubit circuit, and the qubit circuit and readout resonator are placed within a dilution refrigerator to cool the qubit circuit and readout resonator to very low temperatures (e.g., 10 mK).

In a typical readout scheme, a readout pulse is applied to the qubit/readout resonator system through an input line in the dilution refrigerator, and the readout pulse is heavily attenuated through attenuators and filters down to a level of a few microwave photons. In a reflection measurement, the attenuated readout pulse is incident upon a microwave circulator that directs the readout pulse to the qubit/resonator system, where it is reflected with a phase shift depending on the measured qubit state-dependent resonant frequency of the readout resonator. The reflected readout pulse is then directed by the circulator to the output line, where it then passes through isolators and a low-pass filter used to protect the device from the amplifiers and room temperature environment. The readout pulse may first be amplified by a quantum limited amplifier, i.e. an amplifier that adds the minimum amount of noise allowed by quantum mechanics, examples of which are Josephson Parametric Amplifiers, Josephson Parametric Converters, and Traveling Wave Parametric Amplifiers, among others. The readout pulse is then amplified by a high-electron-mobility transistor (HEMT) amplifier at a warmer stage (e.g., 3K), and further amplified by room temperature radio frequency (RF) amplifiers outside the dilution refrigerator before the readout pulse is mixed down and digitized. However, the residual photon population in the readout resonator typically continues to dephase the qubit, limiting the dephasing/decoherence time ($T_2$) until the resonator has sufficiently "rung down".

Embodiments recognize that most microwave filters utilized in current circuit QED architectures are connected to ground by capacitors which consist of dielectrics that do not allow electronic conduction (i.e., are non-galvanic). Embodiments further recognize that these capacitors are usually poor heat conductors because of the properties of the dielectric material between the conductive layers of the capacitor. Accordingly, the signal line is not properly thermalized with the ground part of the capacitor. Because the signal part of the filter is "hotter," there is excess thermal noise. Embodiments recognize that current quantum computing architectures, such as circuit QED architectures, often use Purcell filters to suppress radiation at the qubit transition frequency, which allows for fast readout without sacrificing relaxation time ($T_1$). A Purcell filter is a bandpass filter used to impede microwave propagation at the qubit frequency. The Purcell filter presents an impedance mismatch at the qubit frequency while admitting measurement pulses at the readout resonator frequency.

Embodiments further recognize that current quantum computing configurations often use attenuators to thermalize photon noise by making a galvanic connection through a resistor between a signal line and a temperature stage of the dilution refrigerator.

Various embodiments described herein provide for a method, system, and apparatus for reduction of both spontaneous emission and thermal photon noise in quantum computing machines using a galvanically grounded filter. One or more embodiments provide for a filter galvanically connected to ground to protect qubits in a quantum computing device from both spontaneous photon emission and dephasing in order to maintain coherence.

In various embodiments, a filter, such as a Purcell filter, is coupled to a qubit within a quantum computing circuit and the signal line of the filter is galvanically connected to reference ground for the dual purpose of suppressing spontaneous qubit emission while reducing thermal photon population.

In a particular embodiment, a Purcell filter is coupled between one or more qubits/readout resonator of a quantum computing circuit and the input/output lines to protect the qubits from spontaneous emission and reduce thermal photon noise thereby protecting the qubits from dephasing. In the embodiment, the Purcell filter is galvanically connected to reference ground for making a thermal connection to the signal line to allow more effective cooling of the Purcell filter, thereby reducing thermal photon noise.

In the embodiment, the Purcell filter has a passband around the readout resonator frequency and a stopband around the qubit transition frequency. In another particular embodiment, the Purcell filter may include a stopband around an amplifier pump frequency. In one or more embodiments, the Purcell filter allows transmission of radiation at a readout frequency and suppresses transmission at the qubit frequency and/or amplifier pump frequency.

In one or more embodiments, the filter described herein may be implementing within qubit packaging or on a separated die. In particular embodiments, the filter may be implemented as a microstrip, a stripline, a coplanar waveguide (CPW) microwave transmission line compatible implementation, on a printed circuit board, on a substrate, or on-chip.

In particular embodiments, portions of the filter described herein may be constructed of materials that are lossy at microwave frequencies and/or have differing thermal properties. This includes, but is not limited to, sintered materials that reduce the thermal boundary (i.e., Kapitza) resistance that is an important, dominant effect at the low temperatures at which these quantum devices operate.

The illustrative embodiments are described with respect to certain types of quantum computing circuits, qubits, filters, q-processors, readout resonators, frequencies, operations, algorithms, locations of embodiments, additional data, devices, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments.

Furthermore, a particular illustrative embodiment may have some, all, or none of the advantages listed above.

Figure 2:
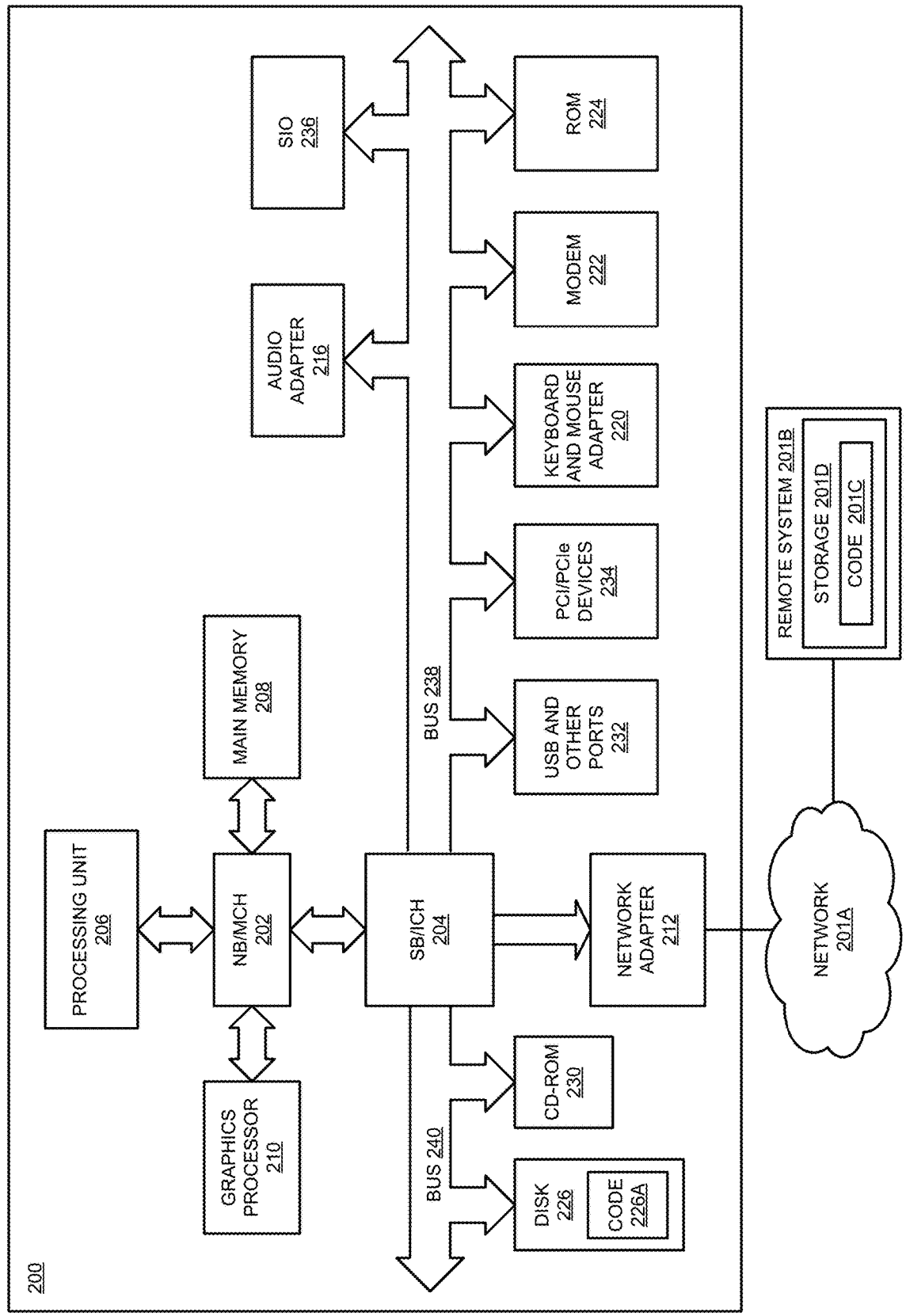
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108 including a database 109 Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

A quantum computing device 146 comprises one or more q-processors 148. A currently viable qubit is an example of q-processor 148. Application 105 implements an embodiment described herein. Application 105 operates on quantum computing device 148 such as providing data for processing by quantum computing device 146.

Quantum computing device 146 may couple to network 102 using wired connections, wireless communication protocols, or other suitable data connectivity. Clients 110, 112, and 114 may be, for example, personal computers or network computers. Network 102 may represent a collection of networks and gateways that use the Transmission Control Protocol/Internet Protocol (TCP/IP) and other protocols to communicate with one another. FIG. 1 is intended as an example, and not as an architectural limitation for the different illustrative embodiments.

Data processing environment 100 as a whole may also take the form of a cloud, and employ a cloud computing model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service.

With reference to FIG. 2, this figure depicts a block diagram of a conventional data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system for any type of computing platform, including but not limited to server systems, personal computers, and mobile devices. An object oriented or other type of programming system may operate in conjunction with the operating system and provide calls to the operating system from programs or applications executing on data processing system 200.

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Figure 3:
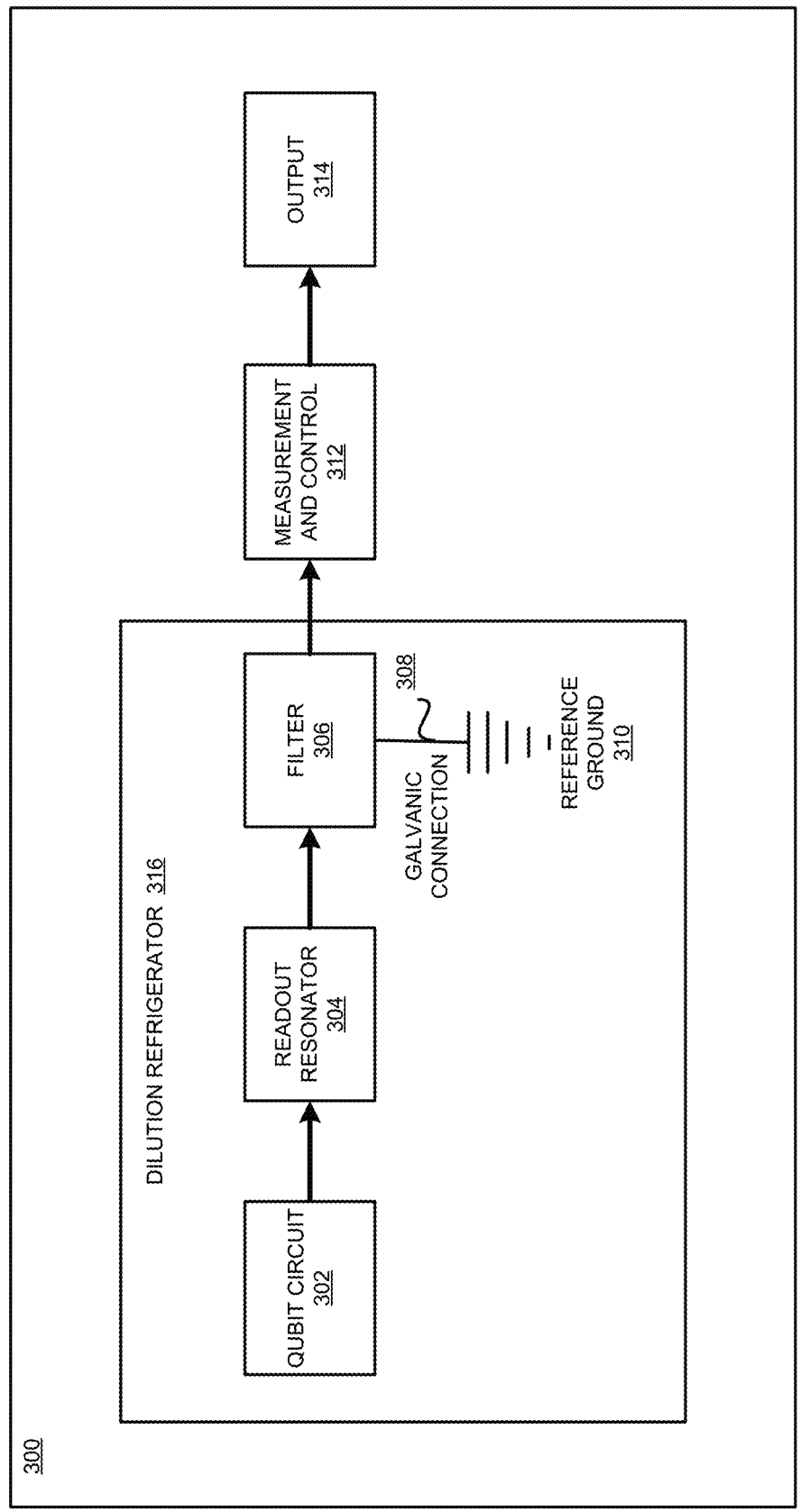
FIG. 3 depicts a simplified block diagram of a quantum computing machine having a galvanically grounded filter in accordance with an illustrative embodiment.

With reference to FIG. 3, this figure depicts a simplified block diagram of a quantum computing machine 300 having a galvanically grounded filter in accordance with an illustrative embodiment. Quantum computing machine 300 includes a qubit circuit 302 coupled a readout resonator 304. Readout resonator 304 is further coupled to a filter 306. In a particular embodiment, filter 306 includes a Purcell filter. Filter 306 has a galvanic connection 308 to a reference ground 310 in intimate thermal contact with a stage of a cryostat at a low temperature (e.g., 10mK). In particular embodiments, a cryostat is a device used to maintain low cryogenic temperatures. Filter 306 is further coupled to measurement and control circuitry 312.

Measurement and control circuitry 312 is configured to measure a signal through reflection to provide an output 314 representative of the output of qubit circuit 302. In the illustrated embodiment, qubit circuit 302, readout resonator 304, and filter 306 are located within a dilution refrigerator 316 configured to cool qubit circuit 302, filter 306, and readout resonator 310 to very low temperatures (e.g., 10mK).

In an example operation of quantum computing machine 300, a measurement pulse from measurement and control circuitry 312 passes through filter 306, interacts with readout resonator 304 which imparts a phase on the measurement pulse encoding the (measured or collapsed) qubit state, at which point it is reflected through filter 306 on to measurement and control circuitry 312. In a particular embodiment, filter 306 has a passband around a readout resonator frequency of readout resonator 304 and a stopband around a qubit transition frequency of qubit circuit 302. In another particular embodiment, filter 306 may include a stopband around an amplifier pump frequency. In the embodiment, filter 306 provides the galvanic connection to reference ground provides for a thermal connection to the signal line and reference ground to protect qubits from spontaneous emission and reduce thermal photon noise. As a result, qubits are protected from dephasing.

In the example operation, measurement and control circuitry 312 controls operation of quantum computing machine 300 and measures an output of readout resonator 310 to produce output 314 representative of the state of the qubit of qubit circuitry 302.

Figure 4:
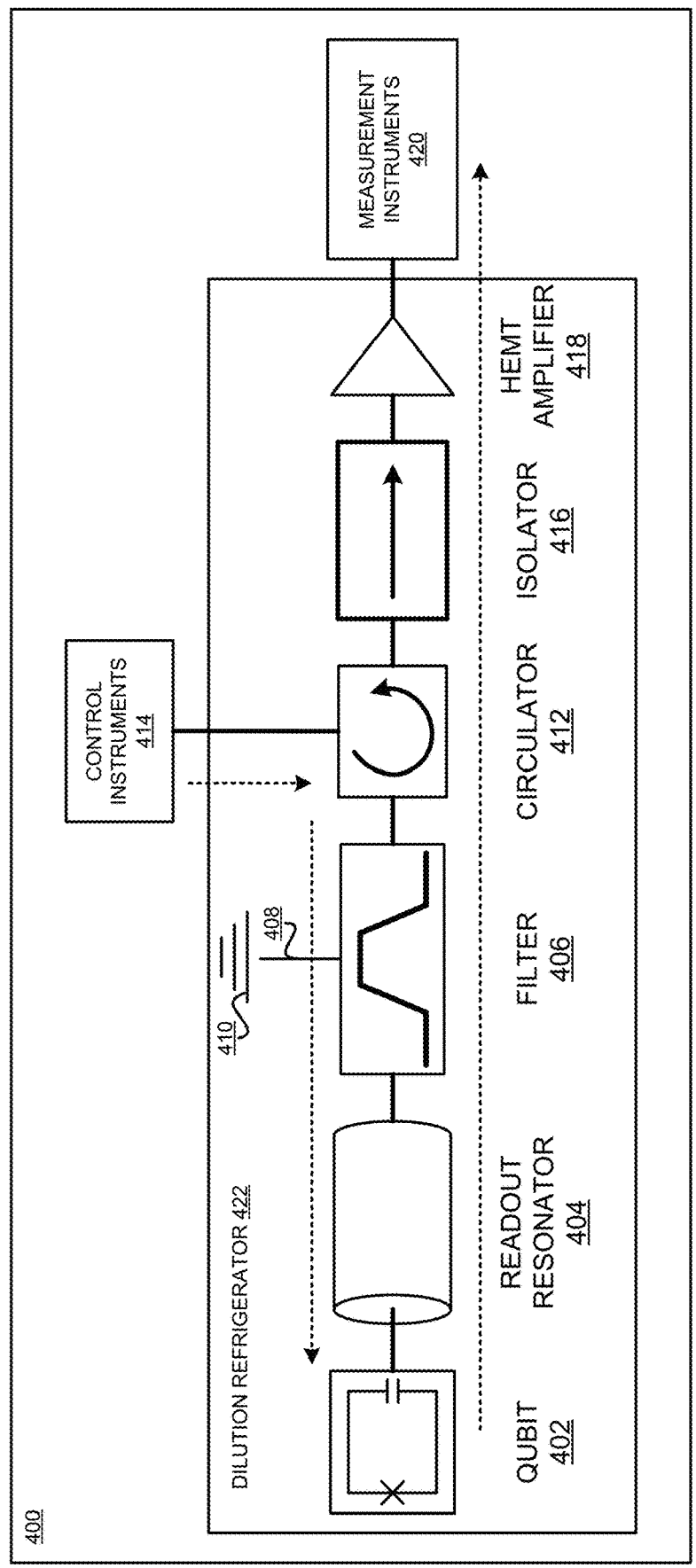
FIG. 4 depicts a simplified block diagram of a quantum computing machine having a galvanically grounded filter in accordance with another illustrative embodiment.

With reference to FIG. 4, this figure depicts a simplified block diagram of a quantum computing machine 400 having a galvanically grounded filter in accordance with another illustrative embodiment. Quantum computing machine 400 includes a qubit chip 402 coupled to a readout resonator 404, and readout resonator 404 is further coupled to a Purcell filter 406 having a galvanic connection 408 to a reference ground 410. Purcell filter 404 is further coupled to an input of a circulator 412. Circulator 412 is further coupled to control instruments 414 and an isolator 416. Isolator 416 is further coupled to HEMT amplifier 420. HEMT amplifier 420 is further coupled to measurements instruments 420.

In the embodiment, qubit chip 402, readout resonator 404, Purcell filter 406, circulator 412, isolator 416 and HEMT amplifier 418 are maintained at a low temperature by dilution refrigerator and reference ground 410 is in intimate thermal contact to a stage of a cryostat such as a dilution refrigerator 422. In the embodiment, Purcell filter 406 provides the galvanic connection to reference ground and provides for a thermal connection to the signal line and reference ground to protect qubits from spontaneous emission and reduce thermal photon noise.

Measurement instruments 420 generate a microwave pulse that is reflected from readout resonator 404 through Purcell filter 406, and circulator 412 routes the reflected signal to measurement instruments 420 through isolator 416 and HEMT amplifier 420. Measurement instruments 420 provides an output representative of a state of the qubit of qubit chip 402.

Figure 5:
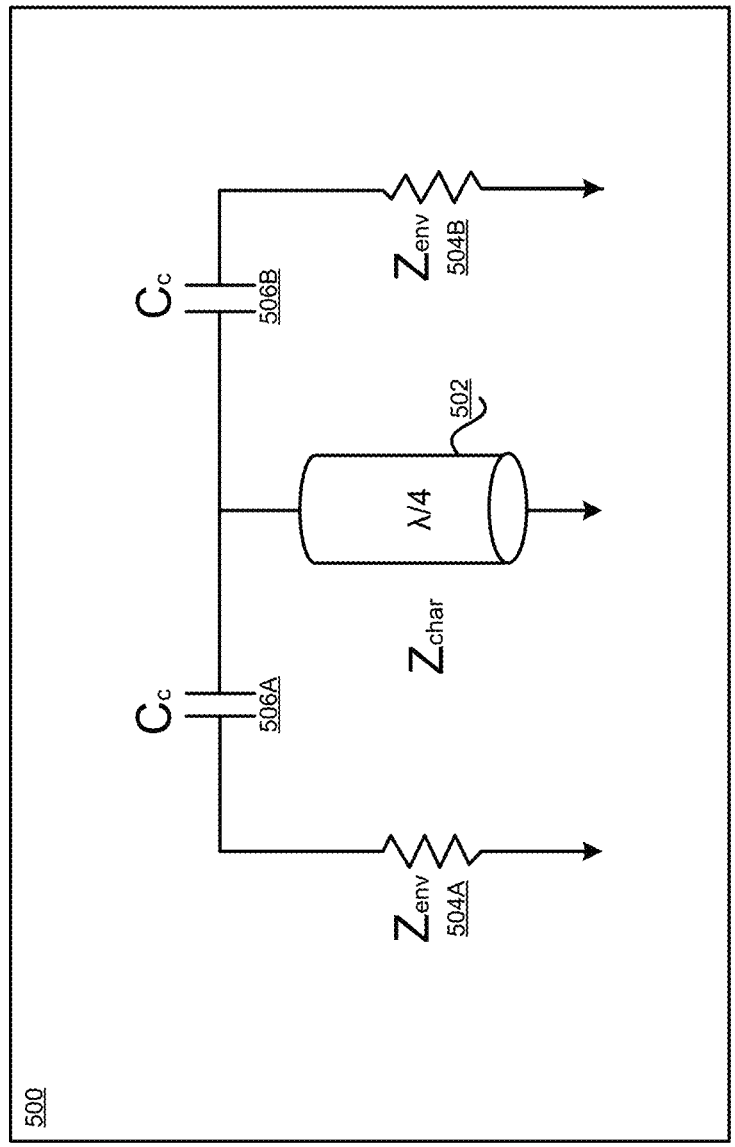
FIG. 5 depicts a simplified equivalent circuit diagram of a Purcell filter having a galvanic connection to ground in accordance with an illustrative embodiment.

With reference to FIG. 5, this figure depicts a simplified equivalent circuit diagram of a Purcell filter 500 having a galvanic connection to ground in accordance with an illustrative embodiment. In a particular embodiment Purcell filter 500 is an example of filter 306 of FIG. 3 or Purcell filter 404 of FIG. 4. In the embodiment, Purcell filter 500 is shown as a quarter wavelength (λ/4) resonator filter.

In the embodiment, Purcell filter 500 includes a quarter wavelength (λ/4) resonator 502 having an impedance $Z_{char}$ having a first connection to a first terminal of a first capacitor 506A and a first terminal of a second capacitor 506B, and a second connection to ground. First capacitor 506A and second capacitor 506B are connected to one another in series and each has a capacitance Cc. A second terminal of first capacitor 506A is coupled to ground through a first environmental impedance 504A, and a second terminal of second capacitor 506B is coupled to ground through a second environmental impedance 504B. Each of first environmental impedance 504A and second environmental impedance 504B has an impedance value $Z_{env}$ of 50 Ohms of a of a microwave transmission line, which represents measurement/control electronics and/or a path to the resonator/qubit)

Figure 6:
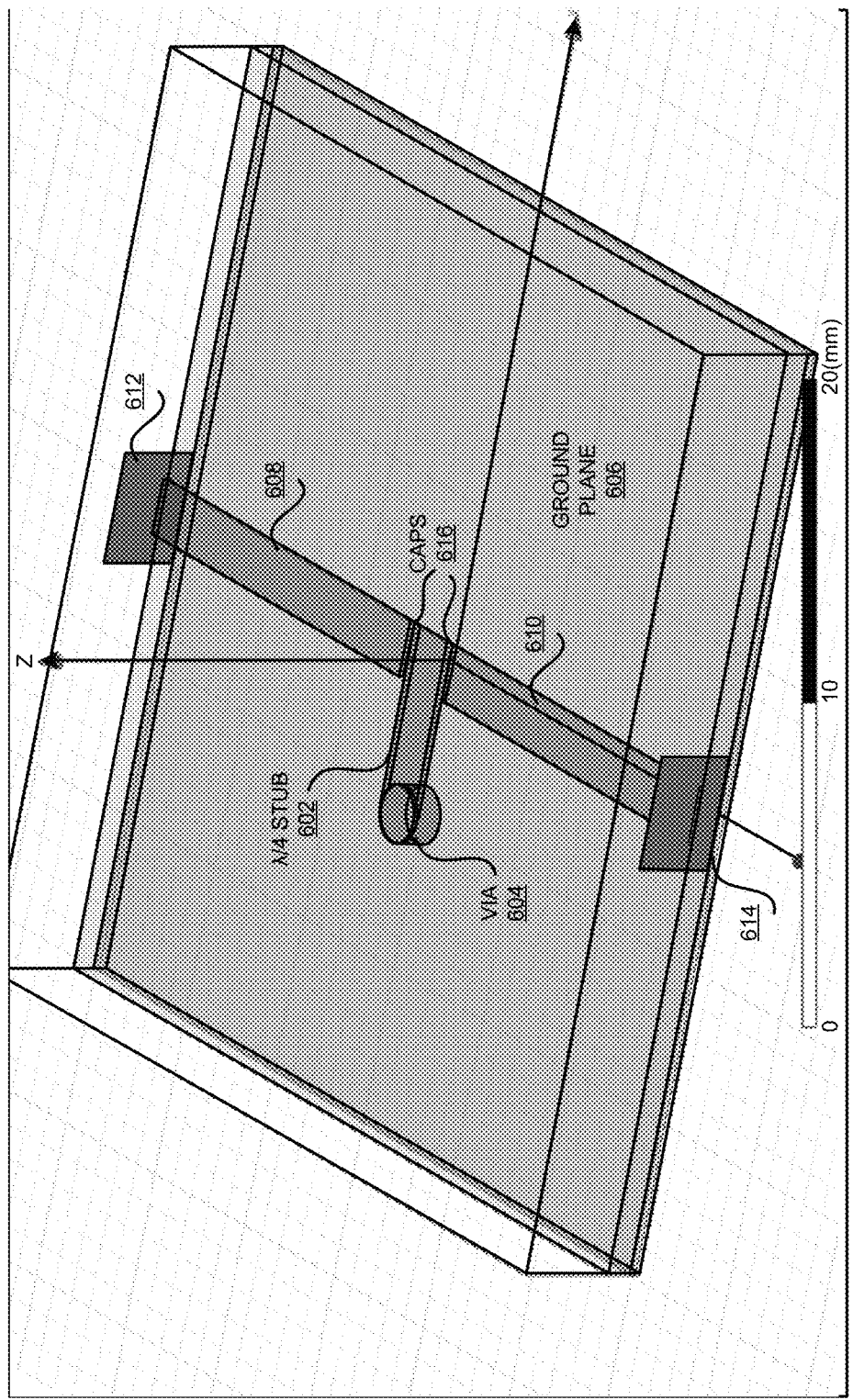
FIG. 6 depicts a perspective view of a simplified structure of a microstrip implementation of a Purcell filter having a galvanic connection to ground in accordance with an illustrative embodiment.

With reference to FIG. 6, this figure depicts a perspective view of a simplified structure of a microstrip implementation of a Purcell filter 600 having a galvanic connection to ground in accordance with an illustrative embodiment. In a particular embodiment, Purcell filter 600 is a microstrip implementation of Purcell filter 500 of FIG. 5.

In the embodiment, Purcell filter 600 is substantially T-shaped and includes a quarter wavelength (λ/4) stub 602 coupled by a via 604 to a ground plane 606 disposed parallel to and below stub 602. Stub 602 is further coupled to and coplanar with a first transmission line 608 and a second transmission line 610 through capacitors 616. In the illustrated embodiment, stub 602 is disposed perpendicular to first transmission line 608 and a second transmission line 610. First transmission line 608 is further coupled to a first microwave port 612, and second transmission line 610 is further coupled to a second microwave port 614. In the illustrated embodiment, first microwave port 612 and second microwave port 614 are disposed perpendicular to first transmission line 608 and second transmission line 610. In the embodiment, Purcell filter 600 forms a bandpass microwave filter having a bandpass frequency around the qubit frequency.

In one or more embodiment, first microwave port 612 is coupled to an output of a qubit circuit, such as qubit circuit 302 or 402, and second microwave port 614 is coupled to an input of a readout resonator, such as readout resonator 310. In one or more embodiments, ground plane 606 is galvanically and thermally coupled to ground to suppress spontaneous qubit emission and reduce the thermal photon population in a quantum computing machine.

Figure 7:
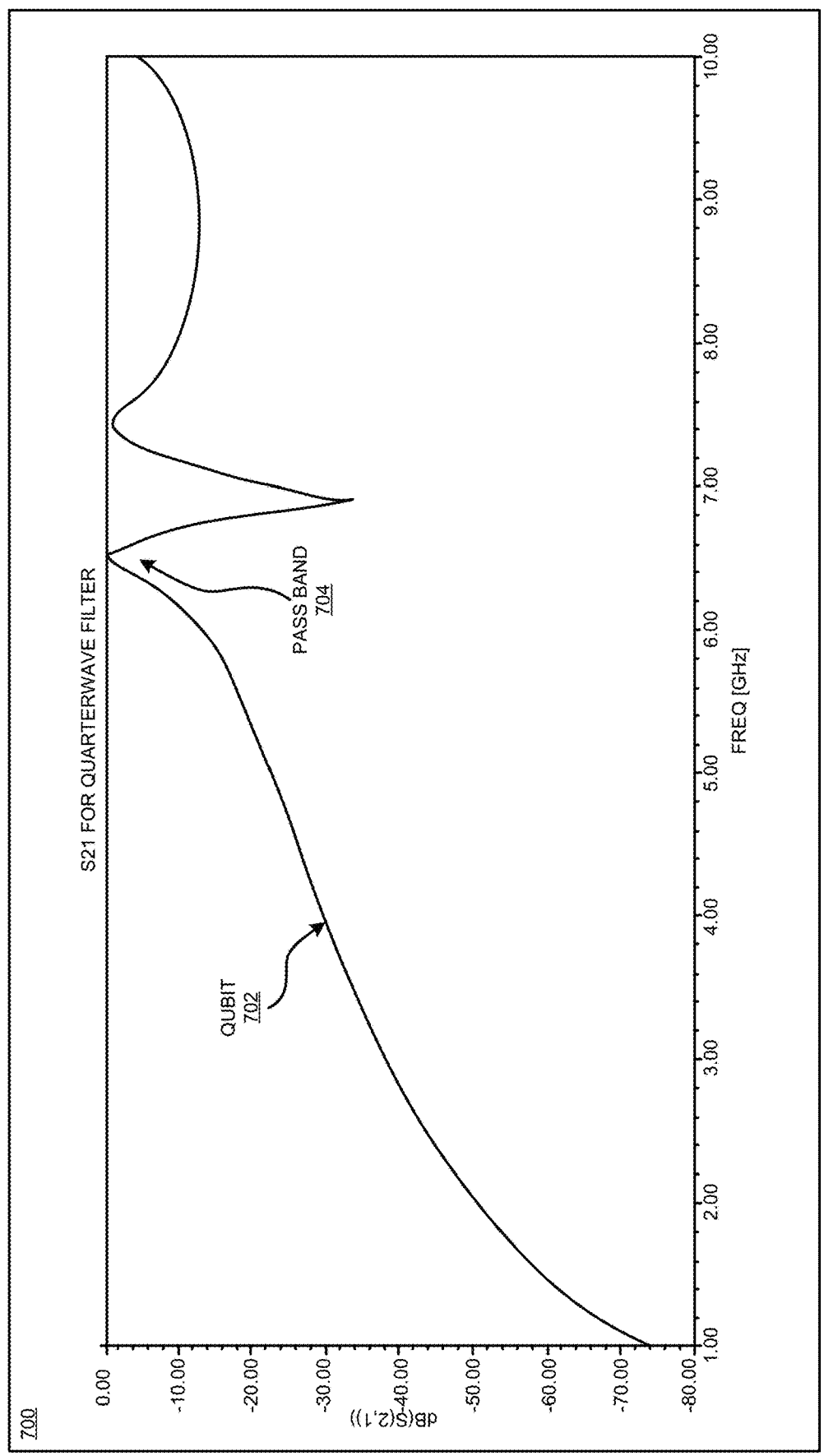
FIG. 7 depicts an example frequency response of the Purcell filter of FIG. 6 in accordance with an illustrative embodiment.

With reference to FIG. 7, this figure depicts an example frequency response 700 of Purcell filter 600 of FIG. 6 determined by finite-element microwave simulation in accordance with an illustrative embodiment. In particular, FIG. 7 illustrates insertion loss (S21) for a frequency range of 0 GHz to 10 GHz of Purcell filter 600 of FIG. 6. FIG. 7 shows a frequency response of Purcell filter 600 for a qubit frequency curve 702. In a particular example, the qubit operates in a frequency range of approximately 4.8 GHz to 5.2 GHz. FIG. 7 illustrates that Purcell filter 600 has a passband 704 around the readout resonator frequency and a stopband around the qubit transition frequency.

Figure 8:
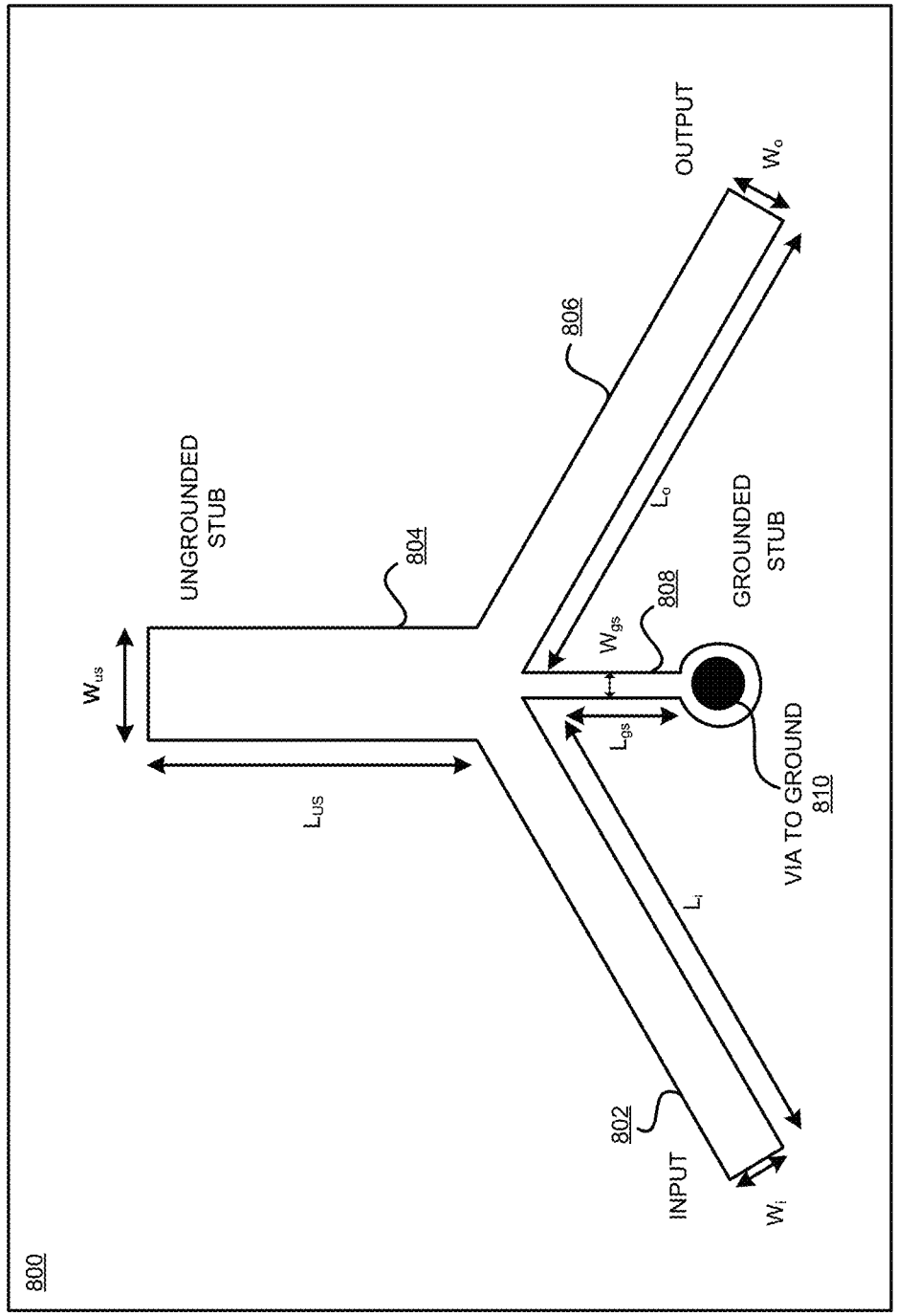
FIG. 8 depicts a simplified structure of another microstrip implementation of a Purcell filter with an inductance-loaded Y-shaped resonator having a galvanic connection to ground in accordance with an illustrative embodiment.

With reference to FIG. 8, this figure depicts a simplified structure 800 of another microstrip implementation of a Purcell filter 802 with an inductance-loaded Y-shaped resonator having a galvanic connection to ground in accordance with an illustrative embodiment.

In the embodiment, Purcell filter 800 includes an input stub 802, an ungrounded stub 804, and an output stub 806 arranged in a Y-shaped configuration. Purcell filter 800 further includes a grounded stub 808 with a circular portion coupled via a via hole 810 to a ground plane. In the illustrated embodiment, first stub 804, second stub 806, third stub 808 and microstrip 810 is disposed on an upper surface and parallel to a substrate and the ground plane is disposed on a lower surface of the substrate. Purcell filter 800 forms a bandpass microwave filter having a bandpass frequency around the qubit frequency.

In the particular embodiment of FIG. 8, input stub 802 has length $L_i$ and a width $W_i$, ungrounded stub 804 has a length $L_{us}$ and a width $W_{us}$, and output stub 806 has a length $L_o$ and a width $W_o$. Grounded stub 808 has a length $L_{gs}$ and a width $W_{gs}$.

Figure 9:
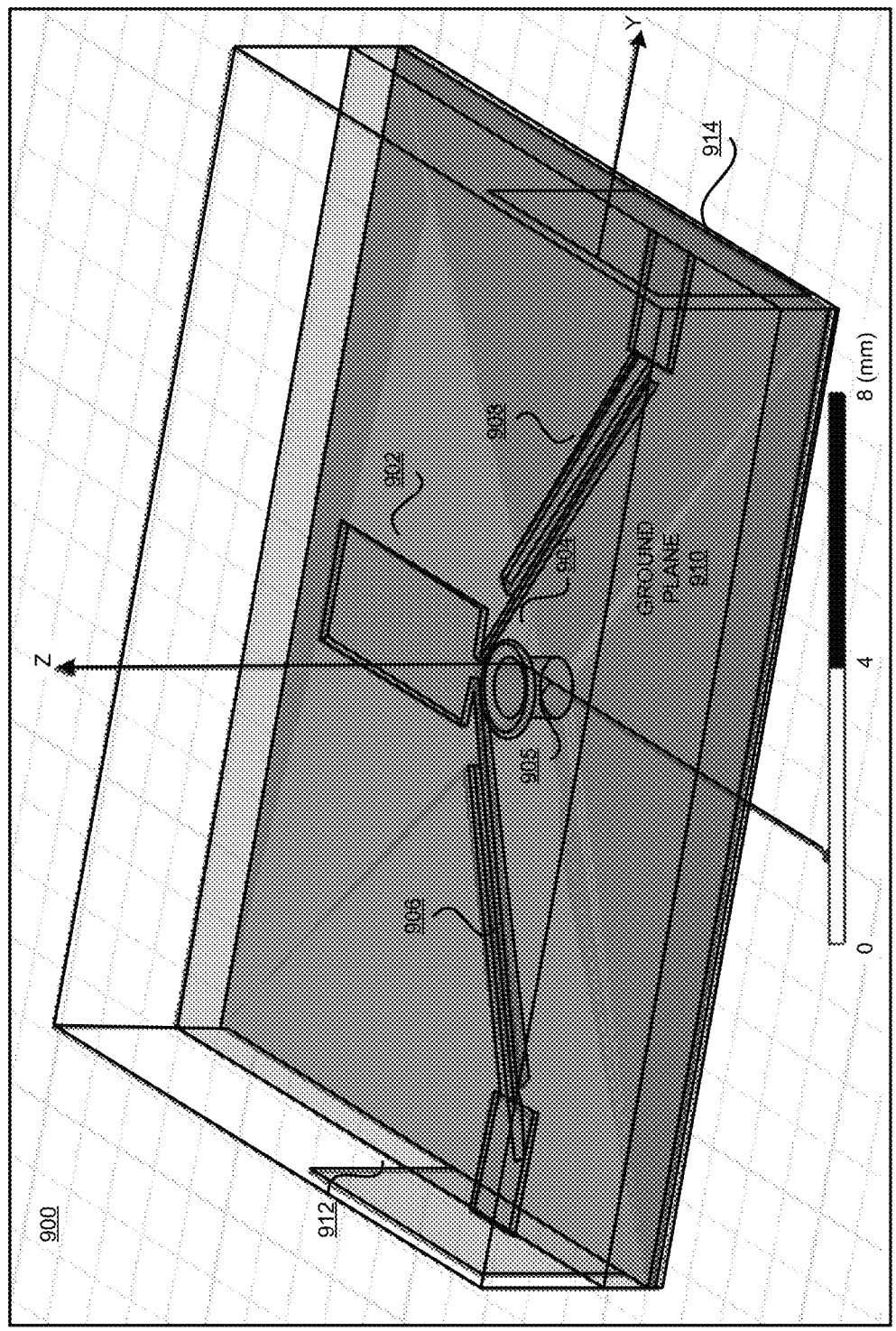
FIG. 9 depicts a perspective view of a simplified structure of a microstrip implementation of a Purcell filter with an inductance-loaded Y-shaped resonator having a galvanic connection to ground in accordance with an illustrative embodiment.

With reference to FIG. 9, this figure depicts a perspective view of a simplified structure of a microstrip implementation of a Purcell filter 900 with an inductance-loaded Y-shaped resonator having a galvanic connection to ground in accordance with an illustrative embodiment.

In the embodiment, Purcell filter 900 includes an ungrounded stub 902, an input stub 906, and an output stub 908 arranged in a Y-shaped configuration. Purcell filter 900 further includes a pad 904 with a via 905 below making galvanic contact with a ground plane 910. In the illustrated embodiment, ungrounded stub 902, input stub 906, output stub 908, and pad 904 are disposed on an upper surface and parallel to a substrate and ground plane 910 is disposed on a lower surface of the substrate.

Input stub 906 is further coupled to a first microwave port 912, and output stub 908 is further coupled to a second microwave port 914. In the illustrated embodiment, first microwave port 912 and second microwave port 914 are disposed perpendicular to input stub 906 and output stub 906. In the embodiment, Purcell filter 900 forms a bandpass microwave filter having a bandpass frequency around the qubit frequency.

In one or more embodiment, first microwave port 912 is coupled to an output of a readout resonator of qubit circuit, such as qubit circuit 302 or 402, and second microwave port 914 is coupled to measurement circuitry such as measurement and control circuitry 312 or measurement instrument 420. In one or more embodiments, ground plane 910 is galvanically and thermally coupled to ground to suppress spontaneous qubit emission and reduce the thermal photon population in a quantum computing machine.

Figure 10:
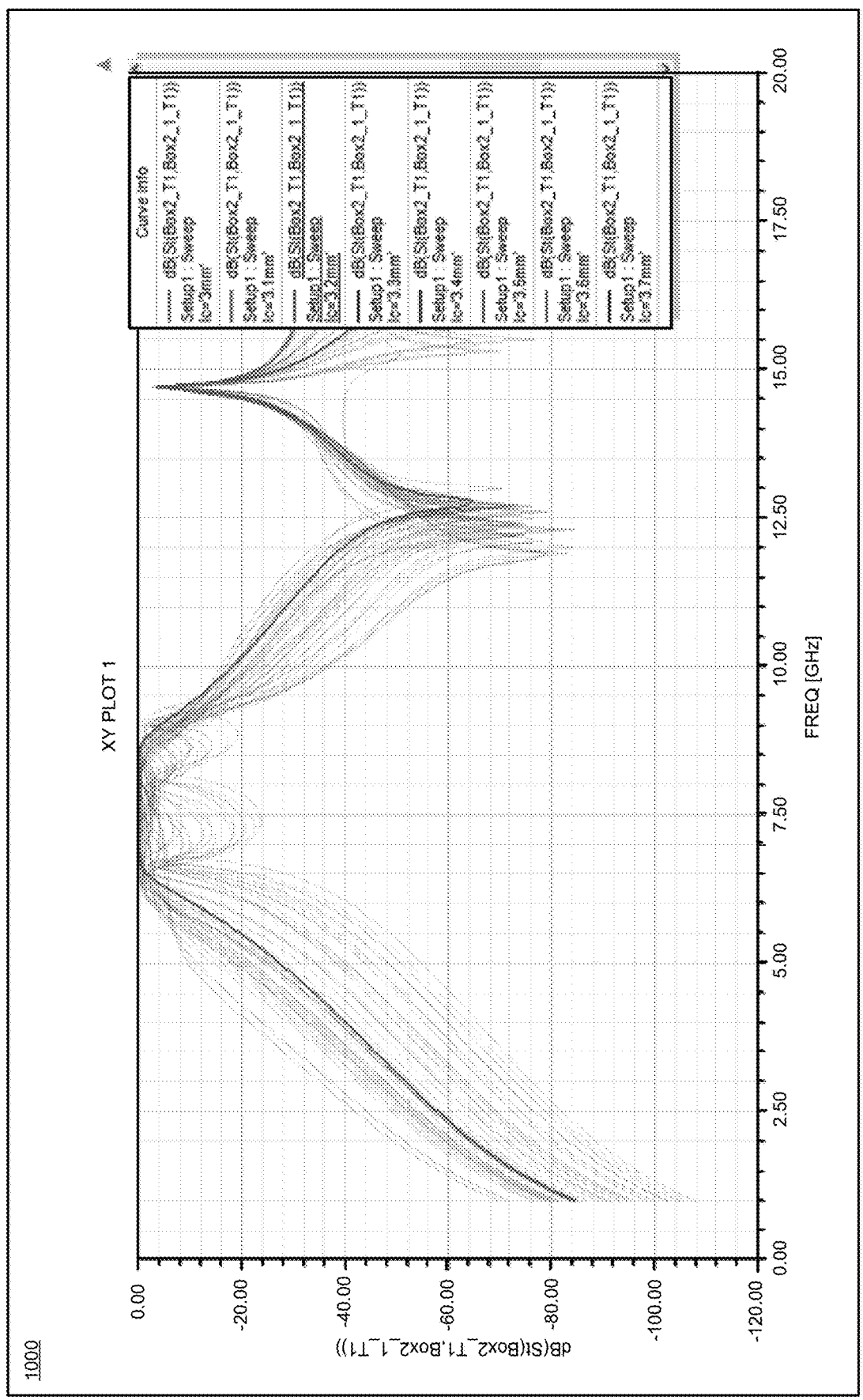
FIG. 10 depicts example frequency responses of the Purcell filter of FIG. 9 as a function of coupler length in accordance with an illustrative embodiment.

With reference to FIG. 10, this figure depicts example frequency responses of the Purcell filter 900 of FIG. 9 as a function of coupler length $l_c$ in accordance with an illustrative embodiment. In particular, FIG. 9 illustrates insertion loss (S21) for a frequency range of 0 GHz to 20 GHz of Purcell filter 900 of FIG. 9. FIG. 9 shows a frequency response of Purcell filter 900 for a number of coupler lengths $l_c$. FIG. 10 illustrates that Purcell filter 900 has a passband around the readout resonator frequency and a stopband around the qubit transition frequency.

Figure 11:
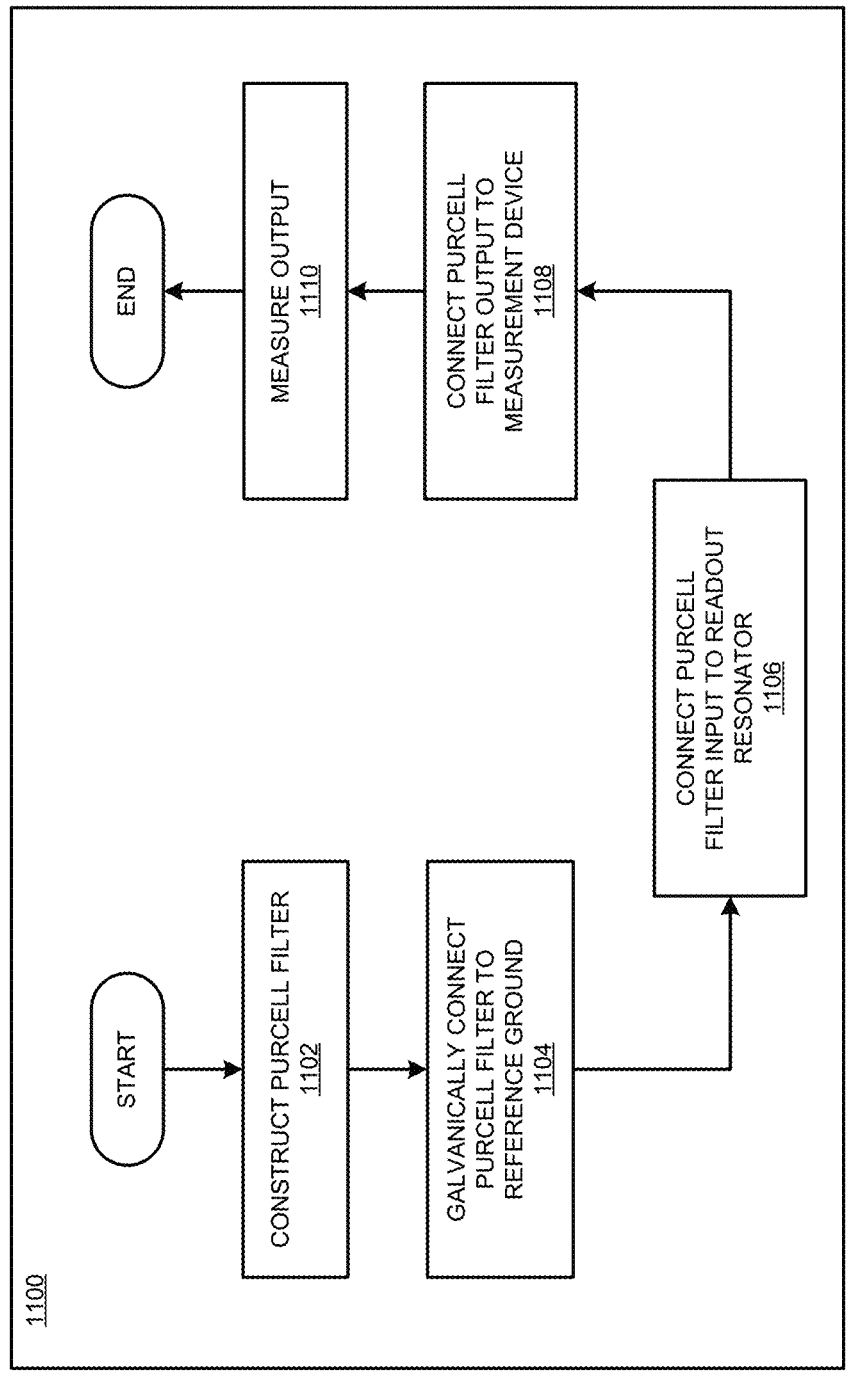
FIG. 11 depicts a flowchart of a process for reduction of thermal photon emission in quantum computing machine qubits using a galvanically grounded filter in accordance with an illustrative embodiment.

With reference to FIG. 11, this figure depicts a flowchart of a process 1100 for reduction of both spontaneous emission and thermal photon noise in quantum computing machines using a galvanically grounded filter in accordance with an illustrative embodiment. In block 1102, a Purcell filter is constructed as described herein with respect to various embodiments. In block 1104, the Purcell filter is galvanically connected to a reference ground. In block 1106, an input of the Purcell filter is connected to a readout resonator of a qubit circuit. In block 1108, an output of the Purcell filter is connected to an input of a measurement device. In block 1110, the output of the readout resonator is measured through the Purcell filter by the measurement device by a reflected measurement. In the embodiment, the Purcell filter functions to suppress spontaneous qubit emission and reduce the thermal photon population in a quantum computing machine. Process 1100 then ends.

Thus, a computer implemented method, system or apparatus, and computer program product are provided in the illustrative embodiments for suppressing spontaneous qubit emission and reduce the thermal photon population in quantum computing machines and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, including but not limited to computer-readable storage devices as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method to protect qubits of a quantum processor from spontaneous emission and thermal photon noise, the method comprising:
    connecting a first port of a filter to a signal line of a readout resonator of a qubit circuit of a quantum processor, the filter having a passband including a readout resonator frequency associated with the readout resonator and a first stopband including a qubit transition frequency associated with the qubit circuit;
    connecting a second port of the filter to a measurement device; and
    galvanically connecting a signal line of the filter to a reference ground in thermal contact to a stage of a cryostat, the galvanic connection further making a thermal connection to an input signal line of the qubit circuit, wherein the thermal connection is configured to reduce thermal photon noise in an output signal line of the qubit circuit.

2. The method of claim 1, wherein the filter includes a bandpass filter.

3. The method of claim 1, wherein the filter includes a Purcell filter.

4. The method of claim 1, wherein the filter further includes a second stopband including an amplifier pump frequency.

5. The method of claim 1, wherein the filter includes a quarter wavelength resonator filter.

6. The method of claim 1, wherein the filter and qubit circuit are disposed within a dilution refrigerator.

7. The method of claim 1, wherein the filter comprises a quarter wavelength microstrip stub coupled to a ground plane.

8. The method of claim 7, wherein the filter further comprises a first transmission line and a second transmission line coupled to and coplanar with the quarter wavelength microstrip stub which terminates to a galvanic connection to a ground plane by a via.

9. The method of claim 8, wherein the quarter wavelength microstrip stub is disposed perpendicular to the first transmission line and the second transmission line.

10. The method of claim 1, wherein the filter comprises an inductance-loaded Y-shaped resonator.

11. The method of claim 1, wherein the filter is constructed of a type of material having a reduced thermal boundary resistance.

12. A system for protecting qubits of a quantum processor from spontaneous emission and thermal photon noise, the system comprising:
    a qubit circuit of a quantum processor, the qubit circuit having a qubit coupled to a readout resonator;
    a filter having a first port of a filter to a signal line of the readout resonator, the filter having a passband including a readout resonator frequency associated with the readout resonator and a first stopband including a qubit transition frequency associated with the qubit circuit; and
    a measurement device connected to a second port of the filter;
    wherein a signal line of the filter is galvanically connected to a reference ground in thermal contact to a stage of a cryostat, the galvanic connection further making a thermal connection to an input signal line of the qubit circuit, wherein the thermal connection is configured to reduce thermal photon noise in an output signal line of the qubit circuit.

13. The system of claim 12, wherein the filter includes a quarter wavelength resonator filter.

14. The system of claim 12, wherein the filter includes a bandpass filter.

15. The system of claim 12, wherein the filter includes a Purcell filter.

16. The system of claim 12, wherein the filter further includes a second stopband including an amplifier pump frequency.

17. An apparatus for protecting qubits of a quantum processor from spontaneous emission and thermal photon noise, the apparatus comprising:
    a filter having a first port for connection to a signal line of a readout resonator of a qubit circuit of a quantum processor, the filter having a passband including a readout resonator frequency associated with the readout resonator and a first stopband including a qubit transition frequency associated with the qubit circuit;
    wherein the filter further includes a second port for connection to a measurement device; and
    wherein a signal line of the filter is galvanically connected to a reference ground in thermal contact to a stage of a cryostat, the galvanic connection further making a thermal connection to an input signal line of the qubit circuit, wherein the thermal connection is configured to reduce thermal photon noise in an output signal line of the qubit circuit.

18. The apparatus of claim 17, wherein the filter includes a quarter wavelength resonator filter.

19. The apparatus of claim 17, wherein the filter includes a bandpass filter.

20. The apparatus of claim 17, wherein the filter includes a Purcell filter.

21. The apparatus of claim 17, wherein the filter further includes a second stopband including an amplifier pump frequency.

\* \* \* \* \*